United States Patent [19]

Pelligrino

[11] Patent Number: 4,606,787
[45] Date of Patent: Aug. 19, 1986

[54] METHOD AND APPARATUS FOR MANUFACTURING MULTI LAYER PRINTED CIRCUIT BOARDS

[75] Inventor: Peter P. Pelligrino, Apple Valley, Minn.

[73] Assignee: ETD Technology, Inc., Shoreview, Minn.

[21] Appl. No.: 571,139

[22] Filed: Jan. 13, 1984

Related U.S. Application Data

[63] Continuation of Ser. No. 354,736, Mar. 4, 1982, abandoned.

[51] Int. Cl.$^4$ .......................... C23F 1/00; B44C 1/22; C03C 15/00
[52] U.S. Cl. ..................................... 156/632; 29/852; 29/848; 156/150; 156/233; 156/247; 156/634; 156/645; 156/656; 156/666; 156/902; 204/15; 427/97; 430/315; 430/318
[58] Field of Search ................ 156/150, 151, 629–634, 156/645, 656, 666, 901, 902, 233, 235, 247; 427/96–98; 430/313, 314, 315, 319, 318; 174/68.5; 361/414; 204/15, 23, 32 R; 29/846, 848, 852, 856

[56] References Cited

U.S. PATENT DOCUMENTS

| | | | |
|---|---|---|---|
| 2,447,541 | 8/1948 | Sabee et al. | 174/68.5 |
| 2,724,674 | 11/1955 | Pritikin | 174/68.5 |
| 2,955,351 | 10/1960 | McCreadie | 174/68.5 X |
| 2,958,120 | 11/1960 | Taylor | 174/68.5 X |
| 3,102,213 | 8/1963 | Bedson et al. | 174/68.5 |
| 3,181,986 | 5/1965 | Pritikin | 156/150 X |
| 3,219,749 | 11/1965 | Schuster et al. | 174/68.5 |
| 3,324,014 | 6/1967 | Modjeska | 156/150 X |
| 3,350,250 | 10/1967 | Sanz et al. | 156/150 |
| 3,471,348 | 10/1969 | Shaheen et al. | 174/68.5 X |
| 3,627,902 | 12/1971 | Meyers et al. | 174/68.5 |
| 3,634,159 | 1/1972 | Croskery | 156/3 |
| 3,694,250 | 9/1972 | Grunwald et al. | 117/50 |
| 3,798,060 | 3/1974 | Reed et al. | 117/212 |
| 3,972,755 | 8/1976 | Misfeldt | 174/68.5 X |
| 4,159,222 | 6/1979 | Lebow et al. | 156/631 X |
| 4,221,047 | 9/1980 | Narken et al. | 29/840 |
| 4,306,925 | 12/1981 | Lebow et al. | 156/150 |
| 4,354,895 | 10/1982 | Ellis | 156/631 |
| 4,401,521 | 8/1983 | Ohmura et al. | 204/12 |

FOREIGN PATENT DOCUMENTS

| | | |
|---|---|---|
| 632087 | 12/1961 | Canada . |
| 954634 | 9/1974 | Canada .............................. 356/18.1 |
| 970737 | 4/1981 | U.S.S.R. . |

OTHER PUBLICATIONS

E. D. Miles, Flush Printed Circuits, IBM Tech. Disc. Bull., V. 1 #2, Aug. 1958.
"Electroforming Circuit Board Process" by Peter P. Pellegrino, published by American Electroplaters' Society, Inc., approximately Jan. 20, 1981 in the AES 8th Symposium on Plating in the Electronics Industry.
"Considerations in Producing High-Density P.C. Boards" published in Mar. 1981 edition of Electronic Packaging and Production.
"NAPCO Plating for Printed Circuits" published in Nov. 1980 edition of Rainbow.
"PCB Lines and Spaces: How Fine?" published in the Apr. 1981 edition of Circuits Manufacturing.
"High Resolution Circuitization Process" by J. G. Cutillo et al, IBM ® Technical Disclosure Bulletin, vol. 20, No. 9, Feb. 1978, pp. 3378–3379.

*Primary Examiner*—William A. Powell
*Attorney, Agent, or Firm*—Merchant, Gould, Smith, Edell, Welter & Schmidt

[57] ABSTRACT

Methods and apparatus for providing fine line, high density multiple layer printed circuit board packages are disclosed. In the method for fabricating multiple layer printed circuit board package, a printed circuit board is formed having a conductive circuit pattern embedded in and integral with an insulator material substrate, such that the surface of the conductive circuit pattern is exposed along one surface of the substrate, and lays flush and coplanar with therewith. At least two of said boards are stacked with a layer of insulator material interposed between each pair of adjacent boards. The entire assembly is heat-pressed together to form a homogenous block of insulator material having conductive circuit patterns embedded and integrally molded therein.

19 Claims, 14 Drawing Figures

METHOD AND APPARATUS FOR MANUFACTURING MULTI LAYER PRINTED CIRCUIT BOARDS

This is a continuation of application Ser. No. 354,736, filed Mar. 4, 1982, now abandoned.

This invention relates to a method for manufacturing dense, fine line printed circuit boards and multiple layer printed circuit board packages.

There are many methods of manufacturing printed circuit boards used extensively throughout the electronics industry. The advent of very large scale integrated circuits ("VLSI") has created an ever increasing demand for higher component density per unit of printed circuit board area. To meet this growing demand, printed circuit boards must be fabricated having extremely narrow conductor line widths and spacings. Because of the limitations inherent in the prior art methods, they cannot successfully meet the industry demands for high yield, multilayer printed circuit boards possessing good dimensional stability and ever-smaller line widths and spacings.

Although there are many methods known and used in the fabrication of printed circuit boards, the most widely accepted methods employ an etching technique. Typically, these methods include the steps of cladding a base of an electrically insulating material with a conductive copper foil, placing a photoresist material in intimate contact therewith, developing the photoresist material to define a conductive circuit pattern thereon, and etching away any exposed foil which is not covered with photoresist to provide a raised conductive circuit pattern.

This prior art method creates several problems since the conductor patterns are not flush with the surface of the circuit board, a conductor line can be easily scratched during handling, resulting in an open circuit. Also, the copper conductor may sliver and bridge across adjacent conductors, causing short circuits.

Furthermore, the etching step in the prior art method may also create a variety of irregularities and defects in the printed circuitry. Etching may result in a conductor being over-etched near its base, thereby undercutting the conductor causing a nonuniform, mushroom-shaped cross-section. Also, photoresist may become trapped beneath the mushroom ledges, preventing foil hidden beneath the trapped photoresist from being etched away. Over-etching, therefore, makes fine line stability and line width control extremely difficult to achieve as line and spacing widths and tolerances grow smaller. Thus, etching fabrication methods can result in multiple conductor line defects, significantly reducing board yields, with a consequent upsurge in rejected printed circuitry which increases final production costs.

Board flatness and dimensional stability are important characteristics for insuring that printed circuitry maintains continuous conductive interconnection with component leads and adjacent boards. However, temperature and pressure fluctuations that occur during lamination cause the board to warp creating considerable stresses to develop in printed circuitry mounted on equipment rails. These stresses cause conductors to break and/or to "swim" off the substrate fabricated by prior art methods because they have poor ductility and do not lay flush with the circuit board.

Quality and stability of multiple layer circuit board packages is also limited by prior art fabrication methods. To make such packages, lamination bonding layers of insulation must be sandwiched between circuit board layers to fill voids between the raised conductor lines and the circuit board substrate. Filling the voids requires high pressures during the lamination process which can destructively distort the conductor lines. Also, even very high pressures cannot insure that the laminate will fill all of the voids. Ultimately, many voids may remain within the finished multilayered package which become a depository of impurities. Such impurities can cause electrical shorts. Further, the lamination bonding layers and board substrates may be of different material composition since they are often supplied by different manufacturers, may be made of different resins, or come from different manufacturing runs. Consequently, the finished multilayer package is not homogeneous. Lack of homogeneity makes it difficult to set proper drill speeds, and drill angles in the fabrication of holes through the multilayers. In some cases the drill speed will be too fast to cut through the copper causing it to tear, but will be the proper speed to cut through the insulation. Thus, some of the layers will have tears, and others will be smooth and some will be extremely uneven, contributing to degraded board quality while increasing unit cost.

Achieving high density in printed circuitry also requires that a uniform, continuous conductive coating be placed on small diameter holes that are drilled through multilayer packages for component leads and interconnects. One technique widely known in the art for making hole walls conductive is electroless plating, whereby an electroless metal deposit, usually of copper, is uniformily coated on the dielectric board substrate. This technique has the disadvantage of depositing a coating that has poor adhesion qualities so that additional steps to insure adequate adhesion are required. Another technique is the application of a thin electroless coating to the hole wall, then eletroplating to further build up the conductive surface. Conventional electroplating techniques, however, cannot access holes having small diameters and large depths demanded by fine line, high density printed circuitry. Therefore the prior art teaches coating very small diameter holes, such as 0.0115 or less totally by electroless processing which takes a substantial amount of processing time—24 hours or more.

SUMMARY OF THE INVENTION

The present invention includes a method of manufacturing fine line, high density printed circuit boards and printed circuit board packages and the circuit boards and packages formed according to the method. A flash layer of conductive material, preferably copper, is electrodeposited onto a rigid metal or metallized substrate that has a low coefficient of thermal expansion. A thickness of of photosensitive resist is deposited onto the first layer by silkscreening or other methods known in the art. A mask is placed over the resist to define a conductive circuit pattern on the surface of the resist. The mask is exposed to light, and the resist is developed. Channels having straight and parallel walls of resist will be formed defining the conductive circuit pattern duplicating the photomask thereby exposing the flash layer.

A second layer of conductive material is built up on the physically exposed portions of the flash layer of conductive material within the channels, forming a raised conductive circuit pattern having a thickness not exceeding the depth of the channels. The remaining photosensitive resist is then removed from the flash layer.

The flash layer and the second layer defining a raised conductive circuit pattern are completely covered with a uniform layer of insulator laminate material. Pressure is applied to fully embed the raised conductors in the insular material, such that the flash layer of conductive material remains in intimate and continuous contact with the insulator material.

The flash layer, integrated with the raised conductive circuit pattern and the insulator material, is separated from the rigid substrate. The flash conductive layer is then etched away, so that the conductive circuit pattern embedded in the insulator material is exposed as laying flush and coplanar with the surface of the insulator material.

Printed circuit boards may be formed having embedded conductors exposed on a single side. However, a double sided board may be fabricated if desired, by heat pressing two such printed circuit boards together, back to back or by embedding the conductors on both sides of a single board.

The completed circuit boards are stacked with a layer of insulator laminate bonding material interposed between each printed circuit board layer. The multiple layers of printed circuitry and interposed insulator material are heat-pressed together to form a homogeneous package of insulator material with conductive circuit patterns embedded therein.

To prepare the boards for components and interconnects, holes are drilled through the homogeneous package. The holes are coated with a thin layer of conductive material, preferably copper, using an electroless coating method so as to provide a conductive substrate for electrodepositing additional conductive material thereon. Using a high impingement speed electrodepositing apparatus, a continuous and uniform thickness of conductive material is plated onto the walls of the holes.

A primary object of this invention is to provide a method for manufacturing fine line, high density printed circuitry whereby the conductive circuit pattern lays flush and aligned with its insulative substrate.

It is a further object of this invention to provide a method for manufacturing fine line, high density printed circuitry whereby the conductor lines have improved ductility characteristics.

It is a further object of this invention to provide a method for manufacturing fine line, high density printed circuitry that has improved dimensional stability.

It is a further object of this invention to provide a method for manufacturing fine line, high density printed circuitry whereby the conductive circuits have a uniform width along its cross-section.

It is a further object of this invention to provide a method for manufacturing fine line, high density multiple layer printe circuit board packages of uniform insulator material which have flat, stable, warp-free, and void-free characteristics.

It is still a further object of this invention to provide a method for fabricating fine line, high density printed circuit board packages having small diameter throughholes of uniform and continuous conductive wall thickness.

Other objects of the invention will become more apparent upon a reading of the following description together with the accompanying drawing in which like reference numerals refer to like parts throughout.

DETAILED DESCRIPTION OF THE INVENTION

Figure 1:
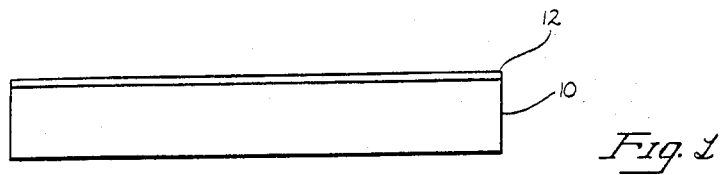
FIG. 1 is a side view of a substrate with a flash layer deposited thereon.
Figure 2:
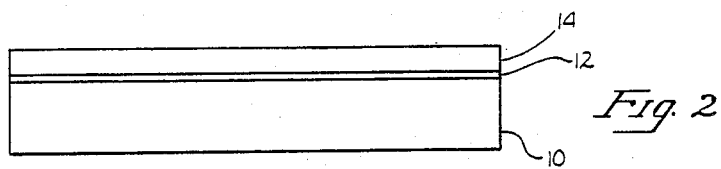
FIG. 2 is a side view of the substrate in FIG. 1, having a layer of photoresist deposited thereon.
Figure 3:
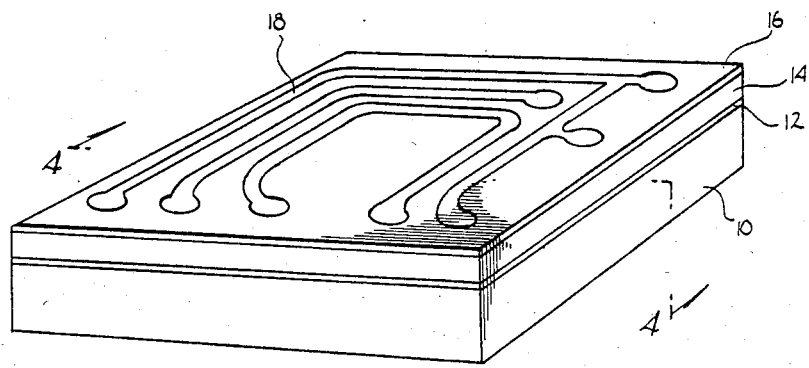
FIG. 3 is a perspective view of the assembly in FIG. 2 with a photomask aligned thereon.
Figure 4:
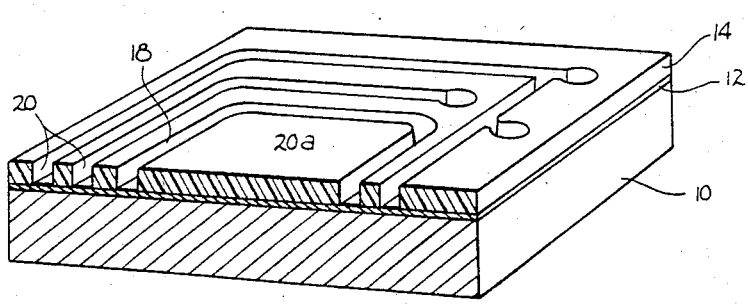
FIG. 4 is a perspective view taken along line 4—4 of FIG. 3 illustrating rectangular channels defining a conductive circuit pattern developed in the photoresist layer after the photomask is removed.
Figure 5:
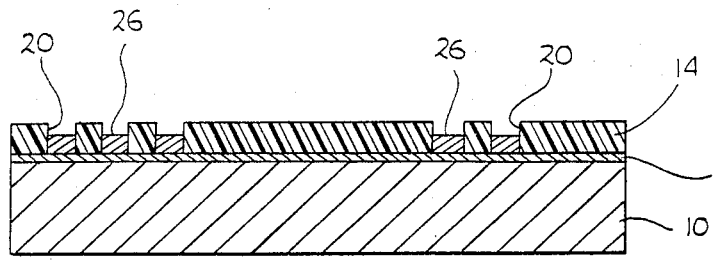
FIG. 5 is a side view of raised conductor lines deposited within the photoresist channels onto the flash layer taken along line 4—4 of FIG. 3.
Figure 6:
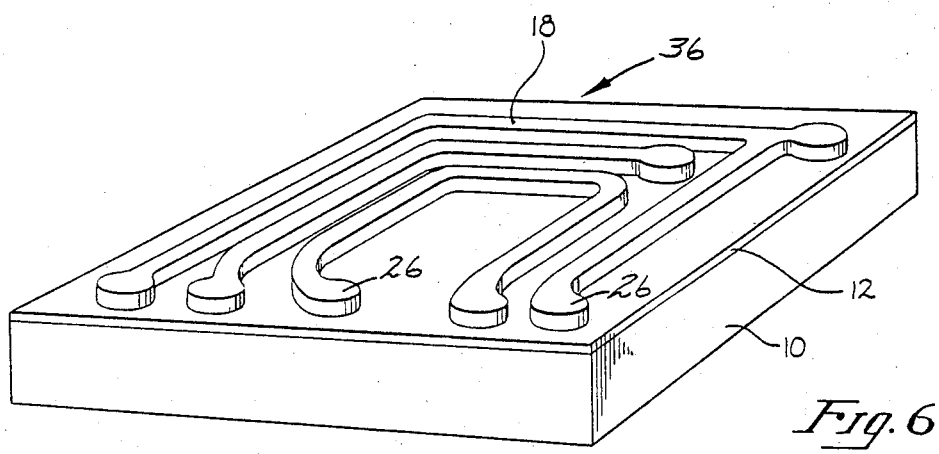
FIG. 6 is a perspective view of the raised conductive circuit pattern of FIG. 5 after the remaining photoresist is removed.
Figure 7:
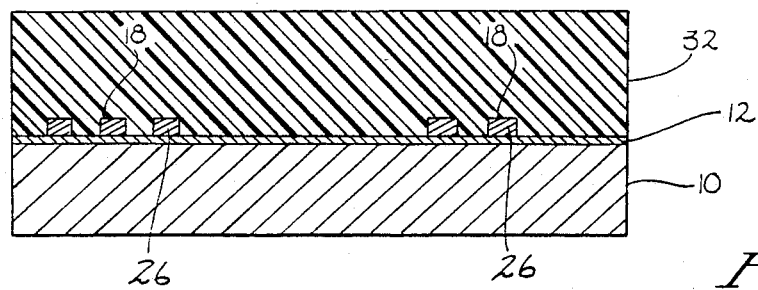
FIG. 7 is a view taken along line 4—4 of FIG. 3 showing a insulator laminate layer covering the raised conductive circuit pattern and flash layer of FIG. 6.
Figure 8:
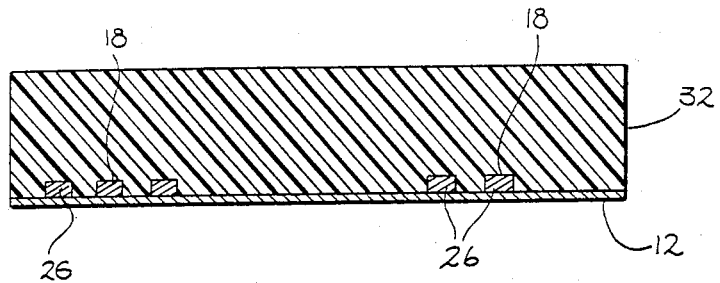
FIG. 8 is a view taken along line 4—4 of FIG. 3 showing the assembly of FIG. 7 removed from the rigid substrate.

Referring first to FIG. 1, a substrate 10 is comprised of a material such as stainless steel having a metallized surface for receiving a flash layer of electrodeposited material. In the preferred embodiment, the substrate is of a rigid metal or a metallized plate. However, many other rigid material compositions having suitable characteristics may be used, such as a metallized glass material for example metallized Pyrex, having a very low coefficient of thermal expansion. The substrate must a low coefficient of thermal expansion to insure that when a conductor is placed thereon, it will not shift or float from its design positions due to the thermal expansion of the substrate caused during a subsequent pressing step.

A flash of electrically conducting material 12, preferably copper, is electroplated onto the substrate 10. The copper flash 12 serves as a base layer upon which further electroplating of conductor lines may be applied. It also serves as a releasing material for separating the printed circuitry from the stainless steel substrate 10 after formation of the printed circuit board is complete, as will be described in detail hereinbelow.

The flash layer is as thin as can be since heat transfer characteristics of a very thin layer tend to rapid heat dissipation during heating, causing improved conductor line stability. Consequently, a flash layer of only 0.0001" to 0.0002" is deposited onto the substrate in the preferred embodiment. Furthermore a very thin layer is less wasteful of copper. The thin electroplated coating is achieved by utilizing an electroplating apparatus commonly known as a high impingement speed plating apparatus, such as is taught in U.S. Pat. No. 4,174,261 known as RISP, available from Economics Laboratory, Inc., Osborn Building, St. Paul, Minn., 55102. Alternatively, any conventional electroplating apparatus may be used for applying the copper flash to the substrate. However, known conventional electroplating apparatus generally cannot plate the extremely thin coating contemplated in the present invention without causing pinholes and other imperfections, and therefore is not preferred.

A low contact pressure is desired at the interface between the flash layer and the substrate to facilitate separating the flash layer from the substrate. Low contact pressure may be accomplished by using dissimilar materials for the flash and for the substrate, such as, but not limited to, using a copper flash with a stainless steel substrate as in the preferred embodiment. Alternatively, materials having similar surfaces may be used if either material is coated with an impurity for reducing adhesion at their interface.

In the preferred method of the invention, the printed circuitry may be fabricated on one side of the stainless steel substrate, but for multilayer applications may be fabricated on both sides of the substrate. This facilitates maximum production output, and allows optimal utilization of electroplating and other apparatus used in the method.

Referring generally to FIGS. 2 through 5, a layer of photosensitive resist material 14, such as Dryfilm, manufactured by Dupont, is applied to the copper flash surface 12 of the substrate 10 using techniques well known in the art. The photoresist will be either positive, such that it dissolves when exposed to light, or negative, i.e., it will not dissolve when exposed to light. A photomask 16 defining a conductive circuit pattern 18, is placed on top of the photoresist layer 14, by techniques widely known in the art. The photomask 16 is aligned and brought into continuous contact with the surface of the photoresist 14 to insure a high resolution of the conductive circuit pattern on the surface of the photoresist 14. The photomask masks the surface of the photoresist such that when it is exposed to light only the areas in which the conductors are to be defined are left exposed.

After the photomask 16 is exposed to light, it is removed, and the photoresist 14 is developed using a commercially available developer such as Resist Stripper manufactured by Dupont. As a result, cavities 20, are formed in the areas where the photoresist 14 dissolved exposing the copper flash 12 previously covered by said photoresist 14 in the defined conductive circuit pattern 18. The walls of cavities 20 are parallel to each other and perpendicular to the substrate 10, amounting to essentially rectangular channels running throughout the remaining undissolved photoresist 14 according to the original conductive circuit pattern 18 defined by the photomask 16.

The entire assembly is placed in a high impingement speed plating apparatus which in the preferred method is the RISP apparatus manufactured by Economics Laboratory, Inc., St. Paul, Minn. A conductive material 26, such as copper, is electrodeposited onto the exposed copper flash 12 at the bottom of the rectangular channels 20, rather than utilizing the subtractive etching method as taught in the prior art. The electrodeposited material 26 is accumulated within the channels to a desired thickness of about 1.2 to about 15 mils, the thickness being selected to prevent mushrooming of the electrodeposited material as happened in the prior art. At no time, however, should the thickness exceed the depth of the channels. The additive electroplating step produces conductor lines 26 having straight and perpendicular side walls of uniform cross-sectional width, facilitating fine line resolution, and making it possible to easily control line widths and densities of extremely narrow dimension. The use of the RISP apparatus enables the conductor lines to be plated with speed and uniformity that is considerably better than can be achieved with conventional electroplating techniques. Additionally, rapid impingement speed electroplating produces a very ductile conductor which is critical in preventing defects and failures in very narrow cross-sectioned conductor lines.

Referring generally to FIGS. 5 through 8, the photoresist layer 14 is chemically stripped away from the copper flash surface 12 exposing the raised electroplated conductive circuit lines 26 arranged in pattern 18. A layer of insulating material 32, such as epoxy coated fiberglass, is laminated to the copper flash layer 12 completely covering the copper flash 12 and the raised conductive circuit pattern 18. Thermosetting insulator materials such as epoxy coated fiberglass are utilized because of their low cost and good temperature characteristics. If epoxy coated fiberglass is not used, alternative materials, such as polypropylene, phenolics, or Teflon material manufactured by Dupont may be used.

The insulating layer 32 is laminated over the conductive circuit pattern 18 and the copper flash layer 12 by the application of heat and pressure as required for laminate material chosen, accomplished with a rigid pattern laminating press such as manufactured by Pasadena Hydraulic of El Monte, California. When epoxy coated fiberglass is used this lamination step can be performed at a pressure of approximately 50-250 pounds per square inch depending on the weave of the glass fabric. (Thicker glass requires more pressure to set the epoxy into the weave) and at a temperature of approximately 425 degrees Fahrenheit. The insulating material 32 will thereby flow and completely fill all the voids between the raised conductor lines 26 and will also achieve a strong bond with the conductors. The insulator material 32 should be of uniform thickness so that the conductor lines 26 of the circuit pattern 18 will be completely covered by the insulator material.

Figure 9:
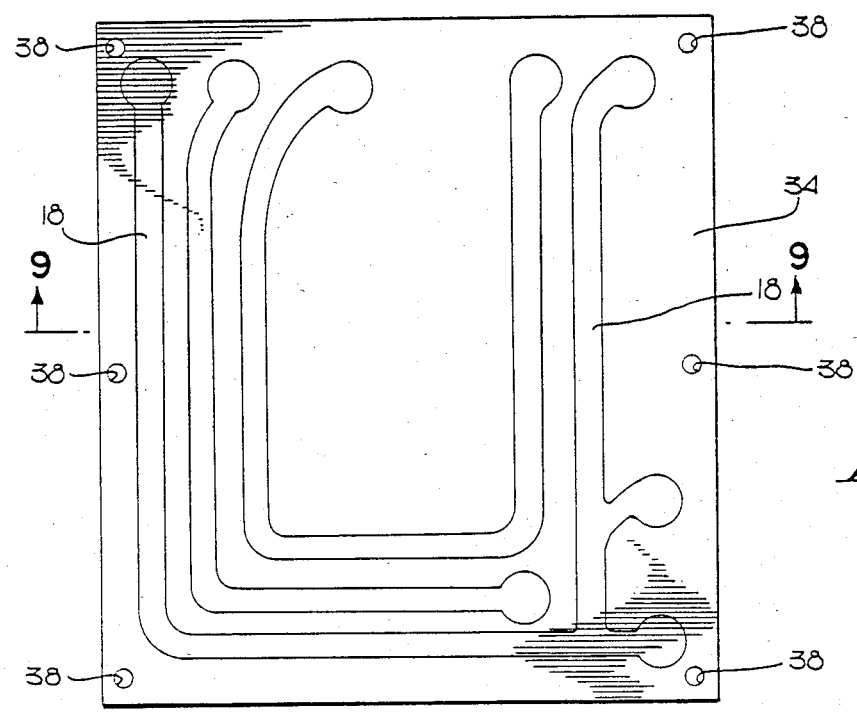
FIG. 9 is a top plan view of the printed circuit board assembly of FIG. 8 with the flash layer etched away thereby exposing the conductive circuit pattern embedded in and aligned flush with the insulator laminate.
Figure 10:
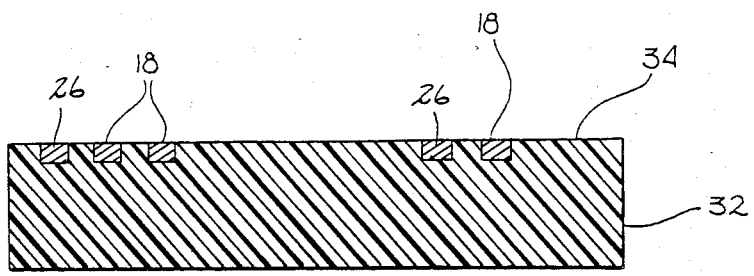
FIG. 10 is a cross-section of the printed circuit board assembly taken along lines 9—9 of FIG. 9.
Figure 11:
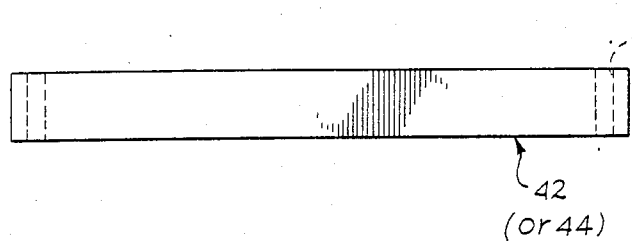
FIG. 11 is a side view of a printed circuit board assembly with registration holes drilled therethrough.
Figure 12:
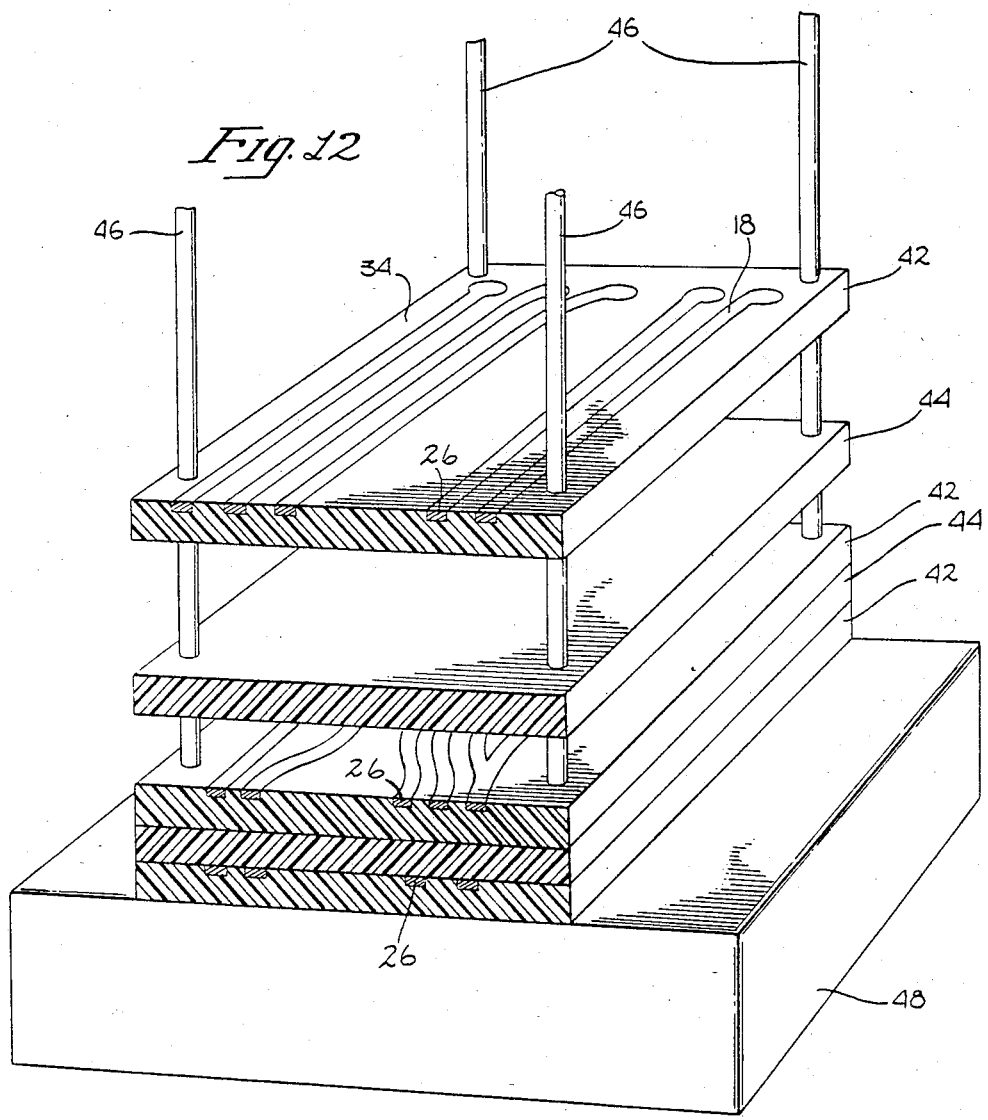
FIG. 12 is a perspective cross-sectional view illustrating multiple printed circuit boards and insulator laminate layers interposed therebetween stacked upon a conventional press.
Figure 13:
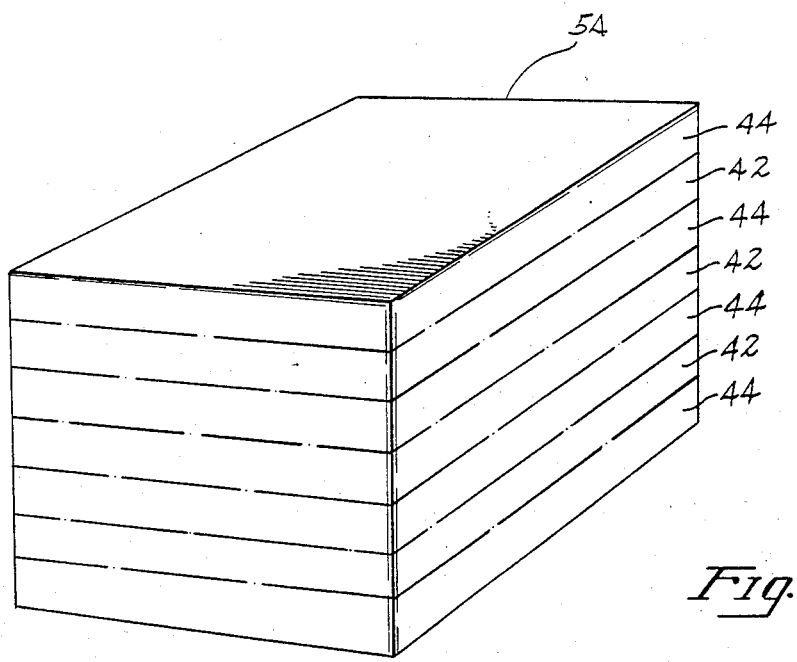
FIG. 13 is a perspective view illustrating a homogenous multi-layer printed circuit board package of the present invention.

The insulator material 32, in which the conductive circuit pattern 18 is molded and embedded and which is bonded to the copper flash layer 12, is manually separated from the surface of the substrate 10. The copper flash layer 12 is then removed from the insulator material 32 using conventional etching techniques or a rapid impingment speed etching apparatus, thereby exposing the conductors 26 of the circuit pattern 18 embedded in the insulator material. FIGS. 9 and 10 show the resulting printed circuit board. As illustrated in FIG. 10, the conductors 26 of circuit pattern 18 lays flush and coplanar with the surface 34 of the insulator material 32, having no abutting edges or protruding surfaces. Thus, the conductive circuit pattern is totally restricted and cannot move. This contrasts with the floating or or shifting tendencies that commonly plague printed circuitry which have been fabricated using prior art methods, having the conductive circuit patterns raised above an insulator material base. The embedded conductor configuration that results from the present inventive method provides a durable and highly stable assembly, enabling large continuous sheets of printed circuitry to be manufactured at extremely close tolerances.

The oxide created on the copper conductors does not bond well to the insulation material. Therefore, the whole board 36 of the conductive circuit pattern 18 is immersed in a chemical bath, such as commercially available under the trademark Macublack from McDermott of Waterbury, Connecticut. The chemical coating improves the adhesion qualities of the laminate, further insuring that, if the board is stacked, the copper surface of one board will adhere to the the laminate surface of an adjacent board. This is particularly important for boards with surfaces exposing mostly copper and thus very little laminate, such as in ground and power boards.

At this stage of the invented process, a single layer of printed circuitry is complete. Having manufactured printed circuitry with the desired conductor patterns, multiple layer printed circuit packages may be fabricated. A layer of insulator material 44 is sandwiched between each layer of printed circuitry 42. This insulator material 44 is of the same composition as that used in the laminate structure of the printed circuitry. Thus, a multiplicity of printed circuit board layers 42 are stacked atop one another, with interposed layers of insulator material 44 sandwiched therebetween.

Referring generally to FIGS. 9 through 13, registration holes 38 are drilled through each printed circuit board 42 and insulation layer 44 that will be included in the multiple layer printed circuit package. An optically guided sighting system, such as that made by Sportonics, of Rockford, Ill. sites the target at which the hole should be made and then drills through the targets such that there is one hole per target. The registration holes 38 provide mounting means for stacking the printed circuit boards 42 and insulation layers 44 on mounting posts 46 so that the multiple layers of printed circuitry will align securely between a pair of pressure plates 48 (only one illustrated).

The multiple printed circuit board layers 42, with insulator material 44 sandwiched therebetween, are pressed together between the pair of pressure plates 48 in a conventional press at a temperature of 375 to 425 degrees Fahrenheit at a pressure of approximately 250 pounds per square inch to form a multi-layer package 54. However, in the preferred embodiment, when 50 psi is used to press a single layer, the same pressure will be used throughout the process.

Prior art multiple printed circuit packages often have layers that use insulator materials of different composition, or made in different manufacturing runs. Fabricating multiple-layer printed circuit board packages in accordance with the present method, however, enables the sandwiched insulator material layers, as well as the laminate base of the printed circuit board layers, to be composed of the same material. This results is a homogenous and continuous material structure when the layers are heat-pressed together to form a multilayer printed circuit board package 54. Also, since the printed circuit board layers of the present method are flush, having no protrusions or indentations, fabrication of the multilayer package is accomplished without voids or other irregularities occurring in the package structure. Further, because the surface of the each circuit board layer is flush, lower pressure may be used to form the multilayer package. The advantage of such low pressure is that warpage or distortion of the package is avoided during the pressing step.

In the prior art, internal shifting and floating that results from the use of high pressure during the multilayer package fabrication step places significant limitations on the number of circuit board layers that could comprise a single multilayer package. In the present invention, the combination of developing a homogenous insulator material in the package, along with eliminating voids through the use of flush printed circuitry, substantially increases the number of printed circuit board layers that can be pressed into a single package. The present method has been regularly practiced on a maximum of 22 board layers, and on a maximum of 40 layers on a more limited basis. However, the method is not thereby limited, and it is possible that packages with even a greater number of boards may be fabricated using the inventive method.

Figure 14:
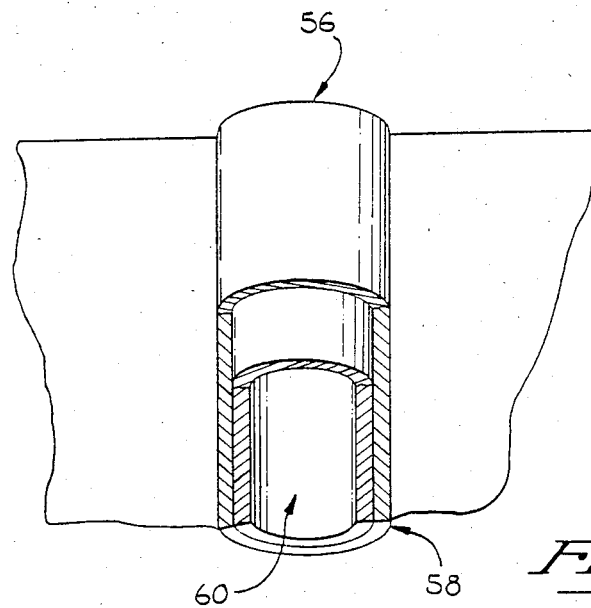
FIG. 14 is a partial perspective view illustrating electrodeposited and electroless plating layers built up on a interconnect or lead hole of the present invention.

Referring to FIG. 14, interconnect and component lead holes 58 are then drilled through the multilayer package 44 using conventional drilling means. The holes are generally between 0.0115 and 0.093 inches in diameter. The holes are then cleaned to removed drill smear using cleaning means well known in the art or by the rapid impingement speed plating apparatus.

As generally illustrated in FIG. 14, a 0.000050 inch thickness of copper 56 is deposited on the hole walls 58 using a conventional electroless plating process. The copper deposit serves as a base for providing sufficient conductivity to carry substantial current for electrolysis. It should be noted that if this copper layer is too thin, it will simply burn away due to the heat generated during electrolysis.

Once again, the holes are cleaned and rinsed to remove impurities and surface dirt. A second thickness of copper 60 is then added electrolytically using the rapid impingement speed plating apparatus, to build up the desired conductive coating thickness along the walls of the hole 58. It is critical to this step that rapid impingement speed plating be used since conventional electroplating means cannot access the long and narrow diameter holes to provide a good conductive coating. Further, the use of the rapid impingement speed electroplating apparatus provides a copper coating having improved ductility characteristics. Thus, thermal or other expansion along the vertical axis of the hole will not cause a break in the conductor surface which could interrupting current flow.

The present invention is capable of fabricating line conductor widths and spaces as narrow as 2 mils, package layers numbering 40 or more having through holes as small as 5 mils in diameter.

While certain embodiments of the present invention have been shown and described above, it will be appreciated that the invention is not limited thereto. Accordingly, it will be understood by those skilled in the art that various changes in form and detail may be made therein without departing from the spirit of the invention.

What is claimed is:

1. A method for fabricating a printed circuit board comprising the steps of:
    (a) electrolytically forming a uniform, relatively pinhole free thin first layer of a conductive material on a polished, homogenous, rigid substrate having a conductive surface; wherein there is low contact pressure between the first layer and the substrate surface;
    (b) depositing photosensitive resist onto said first layer of conductive material;
    (c) masking the photosensitive resist with a photomask to define a conductive circuit pattern on the surface of the resist;
    (d) exposing the masked photosensitive resist to light;
    (e) dissolving those portions of the resist corresponding to the conductive circuit pattern, forming three-dimensional cavities in the resist, to expose said first layer of conductive material according to said circuit pattern;
    (f) electrolytically forming a second layer of conductive material, of the same material as that of said first conductive material, upon the exposed portions of said first layer of conductive material, wherein a raised conductive circuit pattern is formed above the general plane of said first conductive layer, conforming to the three-dimentional cavity definition of the photosensitive resist image; said first and second conductive layers being integrally bonded to one another;
    (g) removing previously undissolved photosenitive resist from said first layer of conductive material, thereby exposing top and sidewall surface portions of said raised conductive circuit pattern configured to the shape of said three-dimensional cavity;
    (h) treating at least the three-dimensional top and sidewall surface portions of said raised conductive circuit pattern so as to provide a chemical conversion coating on said surface portions, thereby enhancing the adhesion properties of said surface portions to laminate insulator materials;
    (i) embedding said raised conductive circuit pattern on said first conductive lyaer within a uniform thickness of laminate insulator material, whereby the laminate material strongly adheres to said raised conductive circuit pattern across the entire three-dimensional said surface portions thereof;
    (j) separating the first conductive layer with said attached laminate and said embedded conductive layer from the rigid substrate; and
    (k) etching away said first conductive layer from said insulator material; whereby the conductive circuit pattern embedded in the laminate insulator material is exposed and lays flush and coplanar with the surface of the insulator material, with uniform cross-sectional thickness across the entire circuit board.

2. The method of claim 1, wherein the raised conductive pattern is embedded in the insulator material by lamination.

3. The method of claim 1, wherein the rigid substrate has a metalized surface and a low coefficient of thermal expansion.

4. The method of claim 1, wherein the first layer of conductive material is electrodeposited on the rigid substrate utilizing a rapid impingement speed electroplating apparatus.

5. The method of claim 1, further comprising the steps of forming conductive holes through said printed circuit board for circuit components and board interconnects.

6. The method of claim 1, further comprising the steps of:
    (a) forming holes through said printed circuit board;
    (b) coating the walls of said circuit board forming said holes with a thin layer of conductive material; and
    (c) forming a continuous conductive surface along the walls of said coated holes.

7. The method of claim 5 wherein said holes are formed by drilling.

8. The method of claim 6, wherein said holes are coated initially by an electroless coating method for providing a thin conductive substrate layer, and subsequently by electrodepositing conductive material on said conductive substrate layer to form the continuous conductive surface along the walls of the coated holes.

9. The method of claim 1, wherein said first layer of conductive material is less than about 0.002 inches thick.

10. The method of claim 9, whrein said first layer of conductive material is less than about 0.001 inches thick.

11. The method of claim 1, wherein said first thin layer of conductive material is substantially free of pinholes; whereby subsequent separation of said first conductive layer with the attached laminate and said embedded second conductive layer, from said substrate, are facilitated.

12. The method of claim 1, wherein said first conductive material layer is formed on said substrate so as to define a low controlled contact adhesion herebetween.

13. The method of claim 1, wherein said raised conductive pattern of said second conductive layer is formed to a thickness of about less than 0.020 inches.

14. The method as recited in claim 1, wherein the thickness of said raised conductor pattern electrolytically formed within said resist cavities is less than the thickness of said resist.

15. The method as recited in claim 1, wherein said substrate comprises stainless steel, and wherein said first layer of conductive material comprises copper.

16. The method as recited in claim 1, wherein said three-dimensional cavities formed in the resist have parallel side walls perpendicular to the exposed surface portions of said first conductive material layer; wherein said raised conductive pattern formed therein has uniform rectangular cross-sectional dimensions with parallel side walls; whereby a fine line, high density; fine-line conductive circuit board patterns can be formed thereby.

17. The method as recited in claim 1, wherein the thickness of said insulator material is no greater than four times that of said raised conductive pattern formed by said second layer of conductive material.

18. The method as recited in claim 15, wherein said second layer of conductive material comprises copper, thereby providing an integral copper-to-copper bond between said first and said second conductive layers.

19. The method as recited in claim 18, wherein said three-dimensional cavities formed in said resist have parallel side walls perpendicular to the exposed surface portions of said first conductive material layer; wherein said raised conductive circuit pattern formed therein has uniform rectangular cross-sectional dimensions with parallel side walls; and whereby the integral bond between said first and said second conductive layers enables fine line, high density conductive circuit board patterns to be formed with said raised conductive patterns, without shifting of said raised conductive patterns relative to said first conductive layer during lamination of said raised conductive pattern within said insulator material.

* * * * *